United States Patent
Takeishi

(10) Patent No.: US 6,859,265 B2
(45) Date of Patent: Feb. 22, 2005

(54) STAGE DEVICE, METHOD OF CONTROLLING SAME, AND EXPOSURE APPARATUS

(75) Inventor: Hiroaki Takeishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 7 days.

(21) Appl. No.: 10/414,472

(22) Filed: Apr. 16, 2003

(65) Prior Publication Data

US 2003/0202166 A1 Oct. 30, 2003

(30) Foreign Application Priority Data

Apr. 24, 2002 (JP) .................................... 2002-122786

(51) Int. Cl.[7] .................. G03B 27/42; G03B 27/58; G03B 27/62
(52) U.S. Cl. ................ 355/72; 355/53; 355/75
(58) Field of Search ................ 355/53, 72, 75

(56) References Cited

U.S. PATENT DOCUMENTS

| | | | |
|---|---|---|---|
| 6,151,100 A | * 11/2000 | Yamane et al. | 355/53 |
| 6,559,927 B1 | * 5/2003 | Tokita et al. | 355/72 |
| 6,570,645 B2 | 5/2003 | Korenaga et al. | 355/75 |
| 2002/0145721 A1 | 10/2002 | Korenaga et al. | 355/75 |
| 2003/0098966 A1 | 5/2003 | Korenaga et al. | 355/75 |
| 2003/0139044 A1 | 7/2003 | Takeishi | 438/689 |
| 2003/0164934 A1 | * 9/2003 | Nishi et al. | 355/72 |
| 2003/0179359 A1 | * 9/2003 | Korenaga | 355/75 |

FOREIGN PATENT DOCUMENTS

| JP | P2000-106344 A | 4/2000 |
|---|---|---|
| JP | 2002-7981 | 1/2002 |

\* cited by examiner

*Primary Examiner*—Rodney Fuller
(74) *Attorney, Agent, or Firm*—Fitzpatrick, Cella, Harper & Scinto

(57) ABSTRACT

A fine (short-stroke) stage is mounted on an XY slider and is capable of being moved over a minute range in the XY directions. Though the XY slider is moved along the X direction by a Y guide bar, movement along the X direction is decided by an X guide bar. If the relative angle between the direction of the X guide bar and the surface of a bar mirror of the fine stage is represented by α, then the X guide bar will be moved by αx when the XY slider has been moved by x along the X direction by the Y guide bar. After the fine stage is thus positioned, the relative positional relationship between the fine stage and the XY slider is held constant.

18 Claims, 13 Drawing Sheets

STAGE DEVICE, METHOD OF CONTROLLING SAME, AND EXPOSURE APPARATUS

FIELD OF THE INVENTION

This invention relates to a stage device ideal for highly precise machining such as semiconductor lithography, a method of controlling this device, and an exposure apparatus having this stage device.

BACKGROUND OF THE INVENTION

Typical prior art examples of an exposure apparatus used in the manufacture of semiconductor devices, and the like, are a step-and-repeat exposure apparatus (also referred to as a stepper) in which, while a substrate (wafer or glass plate) is moved step by step, a plurality of exposure areas on the substrate are successively exposed to a pattern on a master plate (a reticle or mask) via a projection optical system, and a step-and-scan exposure apparatus (also referred to as a scanner) in which exposure transfer of a pattern to a plurality of areas on a substrate is repeated by repeating stepping motion and scanning exposure. In particular, the step-and-scan exposure apparatus makes possible the exposure of fine patterns with higher precision and over a greater angle of view because exposure is limited so that use is made only of a portion of the projection optical system that is comparatively close to the optic axis thereof.

These examples of exposure apparatus have a stage device (wafer stage or reticle stage) for moving a wafer or reticle at high speed to achieve positioning. In order to achieve more precise exposure, however, it is necessary to improve the dynamic characteristics of the stage. The reason for this is that occurrence of deviation (error) of the stage relative to a target position manifests itself as a shift in the exposed pattern. A frequency characteristic is a typical example of a dynamic characteristic. The higher the zero-cross frequency, i.e., the control band, of the frequency characteristic, the better the dynamic characteristics obtained.

One example of a technique for improving the dynamic characteristics of a stage is to adapt an arrangement of coarse adjustment (long-stroke) and fine adjustment (short-stroke) stages. Conceptually, this involves an arrangement in which a fine stage having a small output and a short stroke is mounted on a coarse stage having a large output and a long stroke. In general, if a stage under control is made large in size, it is difficult to raise the resonance frequency of the stage structure itself and, as a result, the control band of the stage is limited to low frequencies. A fine stage specialized for microdrive is such that the stage and its actuators can be made small in size, thereby making it easy to raise the control band. If a fine stage is set up on a stage having a large output and long stroke, therefore, it is easy to raise the stage control band. It should be noted that the control band is composed of frequencies in which the open loop gain is 0 dB. For example, when servo-control is considered, the control band means a range of frequencies that the servo system is capable of following up.

In a stage arrangement having the above-described fine/coarse adjustment structure, generally, the positions of the coarse and fine stages are measured by some method, a feedback loop is constructed using these positions and each stage is controlled. Usually, interferometers are used as means for measuring the stage positions. Such a stage arrangement has been proposed in the specification of Japanese Patent Application No. 2002-0007981, which has been filed by the present applicant. Further, measurement of the positions of fine and coarse adjustment members is disclosed in, e.g., the specification of Japanese Patent Application Laid-Open No. 2000-106344.

The fine stage in such a coarse/fine stage device is adapted so as to afford a very short stroke, which is its original purpose. Consequently, if deviation in the degree of parallelism between a guide bar, which guides the movement of the fine stage, and a bar mirror provided on the fine stage in order to measure the position of the fine stage by a laser interferometer exceeds a predetermined value, a change in relative distance between the coarse stage and the fine stage may exceed the limit of the short stroke of the fine stage. In such a case, the fine stage cannot be controlled correctly.

In order to avoid the above-mentioned problem, it is necessary to strictly regulate the direction along which the coarse stage is driven and the surface of the bar mirror so as to render the two parallel, or to assure that the stroke of the fine stage will be large. The former expedient not only increases labor involved in assembly but also is prone to a change in degree of parallelism ascribable to attaching and detaching of the bar mirror, thus making it difficult to achieve good reproducibility. The latter approach represents a departure from the original purpose of the coarse stage and, hence, makes it difficult to enlarge the control band.

SUMMARY OF THE INVENTION

Accordingly, an object of the present invention is to provide a stage device and a method of controlling same through which it is possible to achieve positioning that exhibits an excellent dynamic characteristic or high precision.

Another object of the present invention is to provide an exposure apparatus in which exposure precision of a pattern is enhanced by applying the above-described stage device to the exposure apparatus.

According to the present invention, the foregoing object is attained by providing a stage device comprising:

a first stage capable of moving in an XY travelling direction in a plane;

a second stage capable of being moved with respect to the first stage over a minutely small range substantially parallel to a direction of movement of the first stage;

first and second measurement means for respectively measuring positions of the first and second stages independently;

driving means for driving the first and second stages using measurement values obtained by the first and second measurement means, respectively; and correction means for correcting drive of the first stage by the driving means, so as to maintain relative positions of the first and second stages, based upon a deviation between an XY direction, which is decided by the second measurement means, the XY travelling direction of the first stage, and the position of the second stage obtained by the second measurement means.

In a preferred embodiment, the correction step corrects drive of the first stage by the driving step in such a manner that the following equations are satisfied:

$$RY = Y + f(x) + \Delta Y$$

$$RX = X + g(y) + \Delta X$$

where the following holds:

RX: target position of the first stage along the X direction;
RY: target position of the first stage along the Y direction;
X, Y: detected position coordinates of the first stage;
x, y: detected position coordinates of the second stage;
ΔX, ΔY: amounts of deviation between position of the second stage and the center position of the range of possible movement of the second stage when the first and second stages have been moved to origin coordinates;
f(x): rational function that decides amount of deviation at position x along the Y direction caused by deviation between the X travelling direction of the first stage and the X direction decided by the second measurement means; and
g(y): rational function that decides amount of deviation at position y along the X direction caused by deviation between the Y travelling direction of the second stage and the Y direction decided by the second measurement means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

<First Embodiment>

Figure 1:
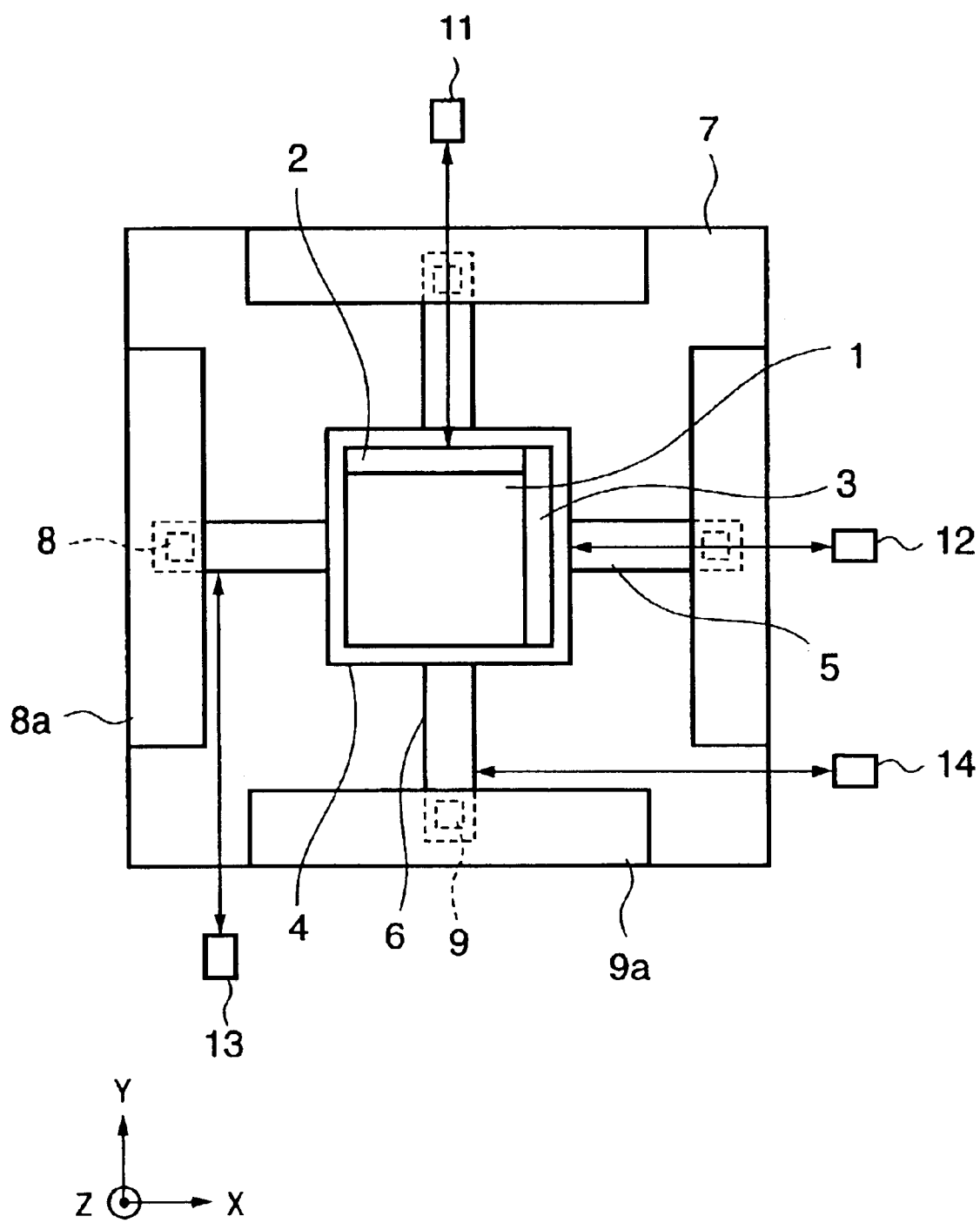
FIG. 1 is a plan view schematically illustrating a coarse/fine stage device.

FIG. 1 is a plan view schematically illustrating a coarse/fine stage device to which the present invention is applied.

As shown in FIG. 1, a fine stage 1 is provided with bar mirrors 2, 3 for position measurement. The bar mirrors 2, 3 reflect measurement light from laser interferometers 11, 12, respectively. The fine stage 1 floats contactlessly on an XY slider 4 serving as a coarse stage provided below the fine stage 1. The fine stage 1 is driven through a very short stroke by linear motors of voice-coil type provided on the XY slider 4. The XY slider 4 is guided along an X guide bar 5 and a Y guide bar 6 by air bearings (static-pressure bearings). The XY slider 4 is slid along the Z direction on the surface of a reference structure 7 by air bearings (static-pressure bearings).

Movable elements (magnets) 8 of a linear motor are attached to the X guide bar 5 near both ends thereof, and movable elements (magnets) 9 of a linear motor are attached to the Y guide bar 6 near both ends thereof. By passing current into stators (coils) 8a of an X linear motor and stators (coils) 9a of a Y linear motor, a Lorentz force is produced so that the X guide bar 5 can be driven in the Y direction and the Y guide bar 6 in the X direction. More specifically, taken as a whole, the X guide bar 5, Y guide bar 6 and XY slider 4 constitute the coarse stage. The X guide bar 5 and Y guide bar 6 have their positions measured by laser interferometers 13, 14, respectively, in a manner similar to that of the fine stage 1.

Figure 2:
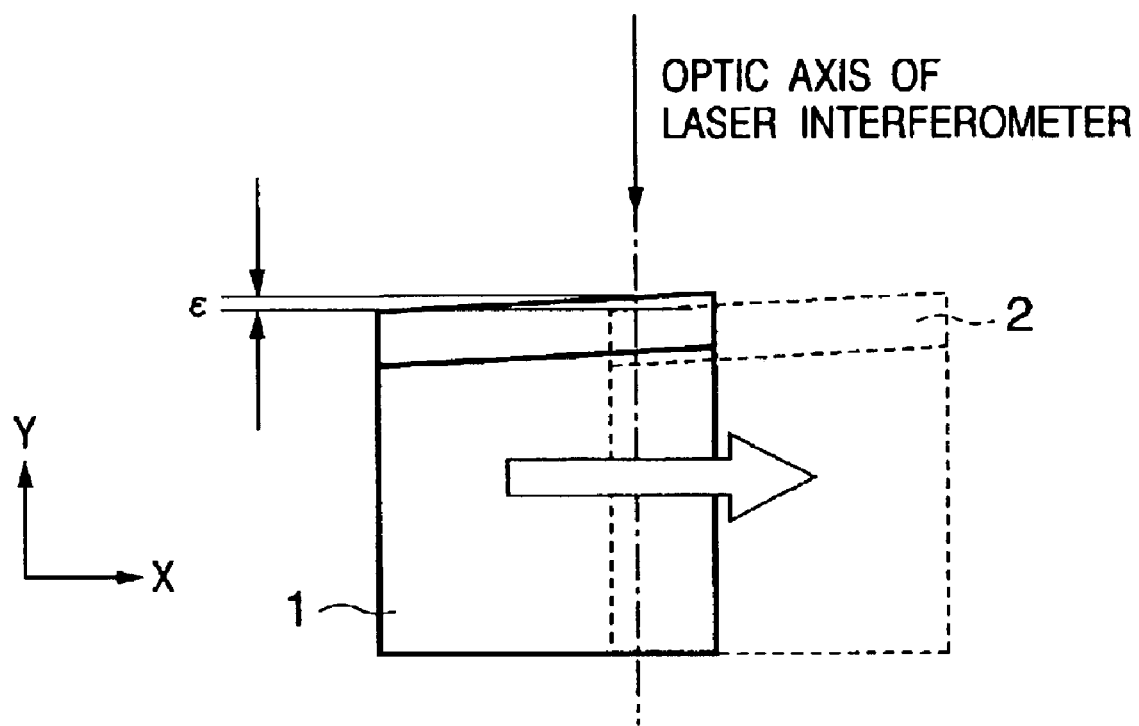
FIG. 2 is a diagram useful in describing a problem relating to stage drive in a state in which the optic axis of a laser interferometer and a bar mirror are not perpendicular.
Figure 3:
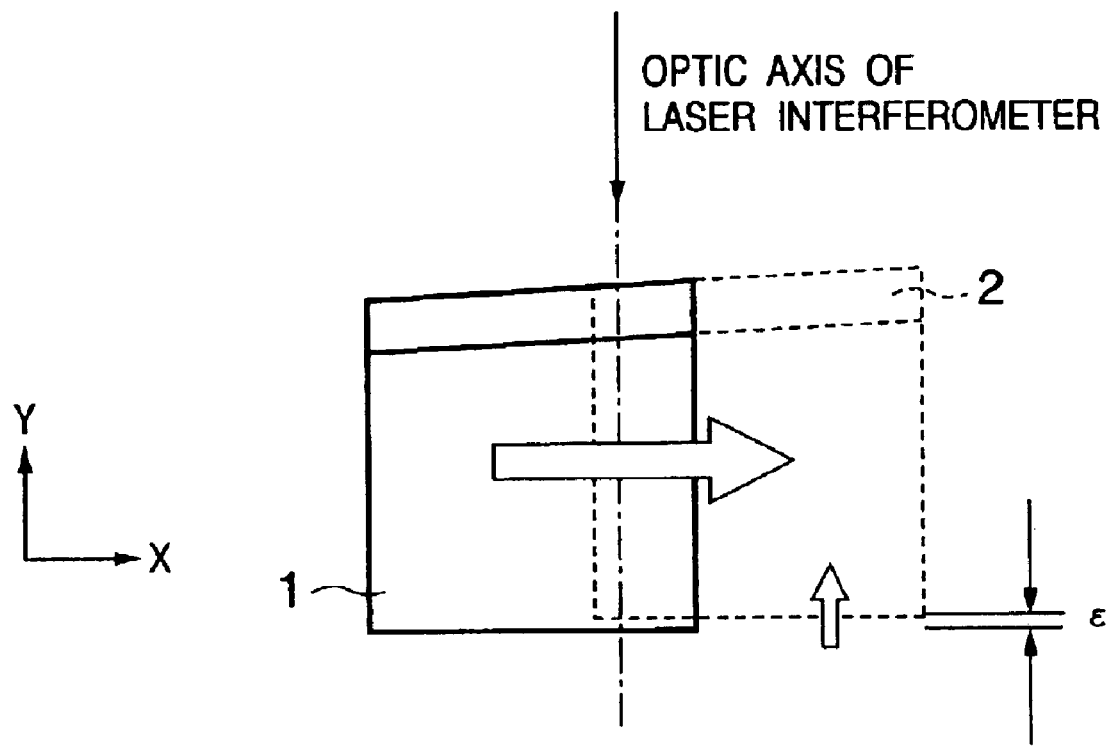
FIG. 3 is a diagram useful in describing a problem relating to stage drive in a state in which the optic axis of a laser interferometer and a bar mirror are not perpendicular.

The position of the fine stage 1 is measured by the bar mirrors 2, 3. The surfaces of the bar mirrors 2, 3 decide the traveling direction of the stage 1. Assume that the optic axis of a laser interferometer and the bar mirror 2 are not perpendicular, as shown in FIG. 2. If the XY slider 4 is moved parallel to the X direction under these conditions (i.e., if only the Y guide bar 6 is moved along the X direction), then the measured value along the Y direction will change (by ε in FIG. 2) in accordance with the inclination of the bar mirror 2. Since the position of the fine stage usually is controlled based upon the measured values from the laser interferometers, the fine stage moves by ε along the Y direction. As a result, the XY slider 4 is driven parallel to the inclination of the bar mirror, i.e., obliquely with respect to the optic axis of the laser interferometer (see FIG. 3).

Figure 4:
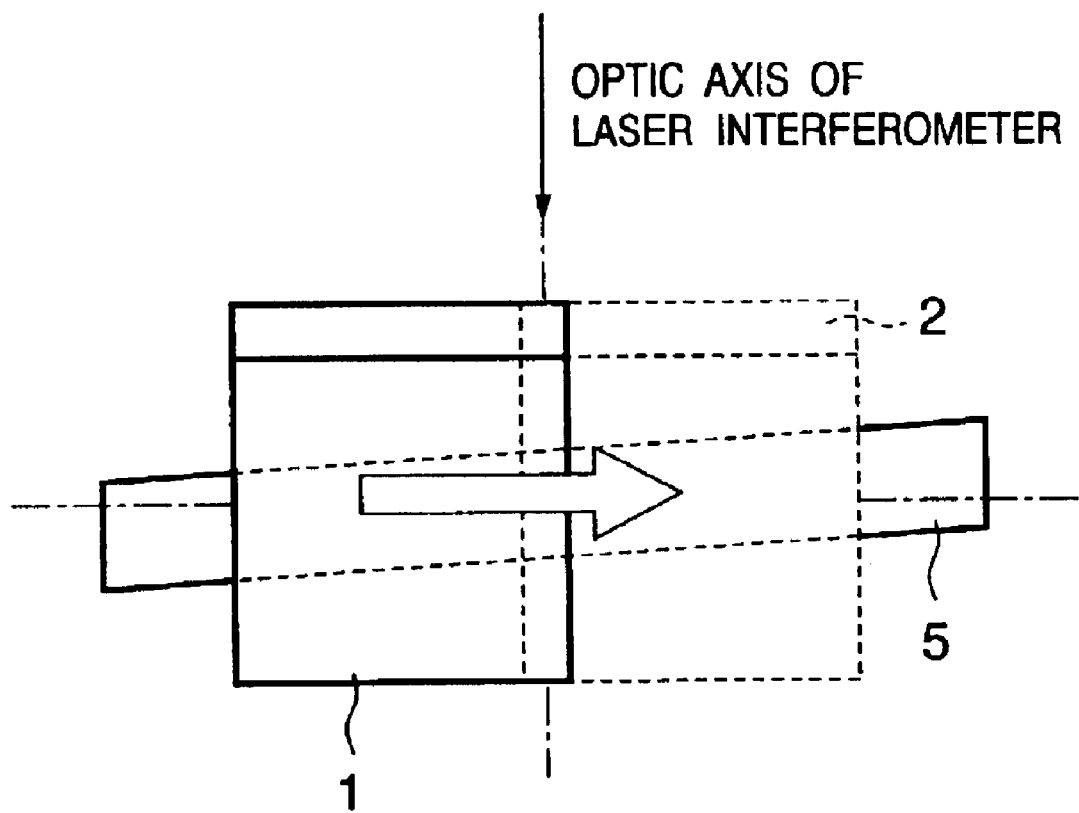
FIG. 4 is a diagram useful in describing a problem relating to stage drive in a case where the driving direction of a guide bar and the surface of a bar mirror are not parallel.

Further, assume that the bar mirror 2 is perfectly perpendicular to the optic axis of the laser interferometer. The X guide bar 5 or Y guide bar 6 similarly is controlled based upon the position measured by the laser interferometer. Consequently, if the driving direction of each guide bar and the surface of the bar mirror are not parallel, the relative positions of the XY slider 4 and fine stage 1 after the guide bars (5, 6) and fine stage 1 have been moved to the target position change depending upon the position of the stage in the XY direction. The situation is illustrated in FIG. 4. Specifically, if the fine stage 1 is moved parallel to the X direction, then the fine stage 1 is moved to a position indicated by the dashed lines in FIG. 4 by movement of the Y guide bar 6 and by the actuator of the fine stage 1. As a result, the relative positional relationship between the X guide bar 5 (i.e., the XY slider 4) and fine stage 1 changes. This will now be described in greater detail.

Figure 5A:
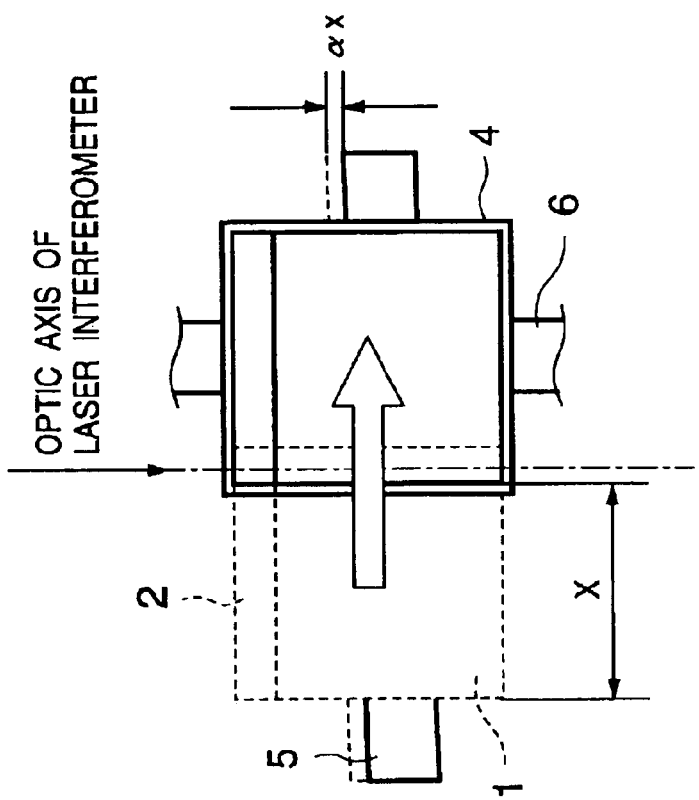
FIGS. 5A and 5B are diagrams useful in describing a correction operation in a case where the X-drive direction of a coarse stage and the X-drive direction of a fine stage have deviated from a parallel condition by an angle α.
Figure 5B:
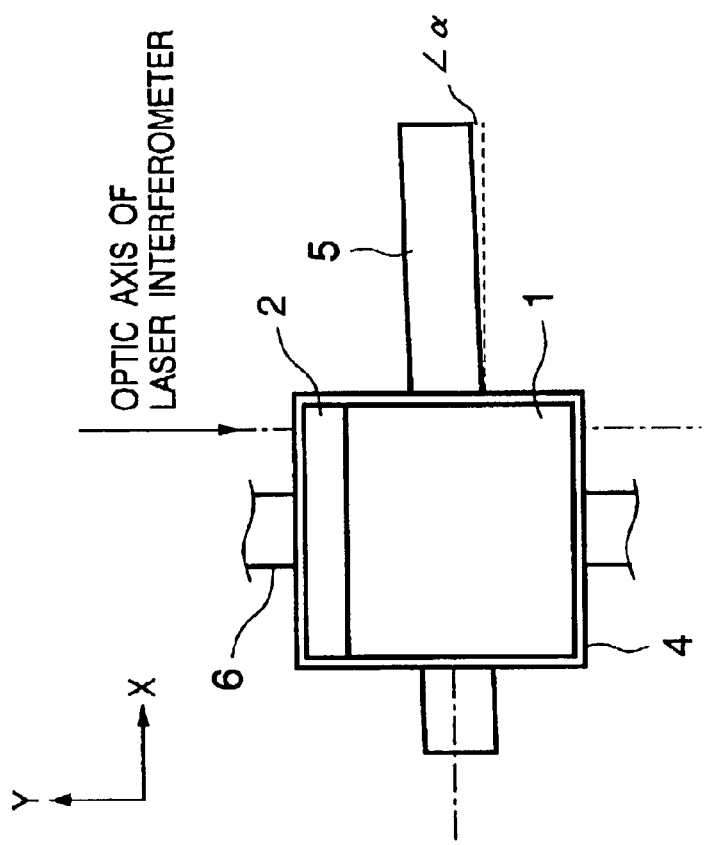

FIGS. 5A and 5B illustrate a case where the X-drive direction (i.e., the direction along the X guide bar 5) of the coarse stage (constituted by the X guide bar 5, Y guide bar 6 and XY slider 4) and the X-drive direction of the fine stage 1 (i.e., the surface of the bar mirror 2) are non-parallel by an angle α. More specifically, FIGS. 5A and 5B illustrate a case where there is a deviation between the XY direction decided by the measurement system of the fine stage and the XY direction in which the coarse stage is moved, with α being the relative angle between the X direction of the measurement system of the fine stage and the X direction along which the coarse stage is moved.

Now assume that the fine stage 1 has been driven by x along the X direction together with the coarse stage. As a result, the relative distance between the coarse stage and fine stage changes by αxx along the Y direction. In a case where the stage is moved by x along the X direction, therefore, the relative distance between the coarse stage (XY slider 4) and fine stage 1 is held constant if the position of the coarse stage is moved by αxx along the Y direction.

It should be noted that the relative angle α relating to the X direction has been described with reference to FIGS. 5A, 5B. However, the relative angle between the Y direction of the measurement system of the fine stage and the Y direction of movement of the coarse stage also can be obtained in a similar manner. This relative angle shall be designated by β in the description below.

A stage driving apparatus according to this embodiment implements the control described above. A block diagram of the control system is depicted in FIG. 6, which illustrates implementation of control for correcting drive of the fine stage 1 along the X direction and drive of the coarse stage along the Y direction.

Figure 6:
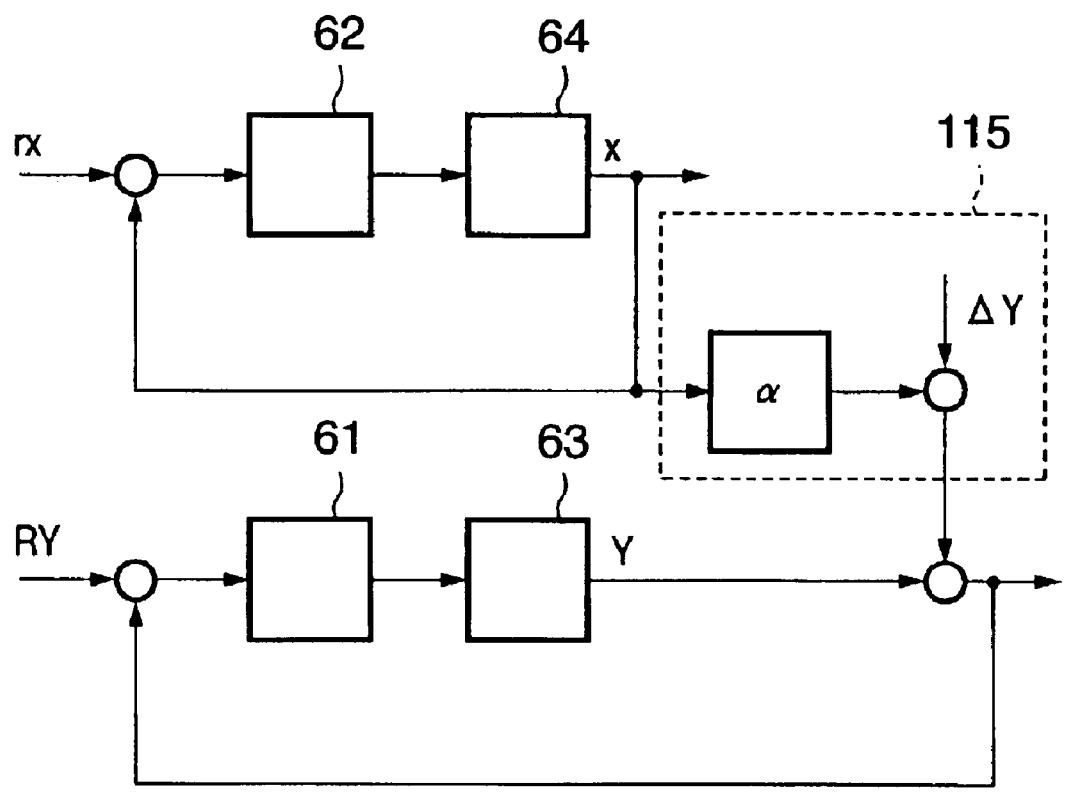
FIG. 6 is a block diagram illustrating implementation of stage drive control by a stage drive unit according to an embodiment of the present invention.

As shown in FIG. 6, compensating units 61, 62 for the coarse and fine stages are disposed in front open-loop characteristics 63, 64, respectively, of the coarse and fine stages, whereby stage position is fed back. The open-loop characteristic 63, which includes the drive section of the X guide bar 5 and the laser interferometer 13, moves the X guide bar 5 in accordance with the output of the compensating unit 61 so that a signal from the laser interferometer 13 representing the position of the X guide bar 5 is output as Y. Similarly, the open-loop characteristic 64, which includes an actuator for moving the fine stage 1 minutely along the X direction and the laser interferometer 12, moves the fine stage 1 in accordance with the output of the compensating unit 62 so that a signal from the laser interferometer 12 representing the position of the fine stage 1 is output as x. It should be noted that a PID compensator or like can be mentioned as an example of the compensators 61, 62.

In FIG. 6, RY represents the target position of the coarse stage along the Y direction, and rx represents the target position of the fine stage. As mentioned above, Y represents the coordinate of the position of the coarse stage along the Y direction detected by the laser interferometer 13, and x represents the coordinate of the position of the fine stage 1 along the X direction detected by the laser interferometer 12.

A position correction unit 115 in FIG. 6 implements the correction of the position of the coarse stage described above with reference to FIGS. 5A, 5B. Specifically, using α and the position x of the fine stage 1 along the X direction, the position correction unit 115 corrects the position value Y of the coarse stage along the Y direction measured by the laser interferometer 13 and feeds back the corrected value to construct the control loop of the X guide bar. This makes it possible to correct automatically the change in relative distance ascribable to the angle α.

Figure 8:
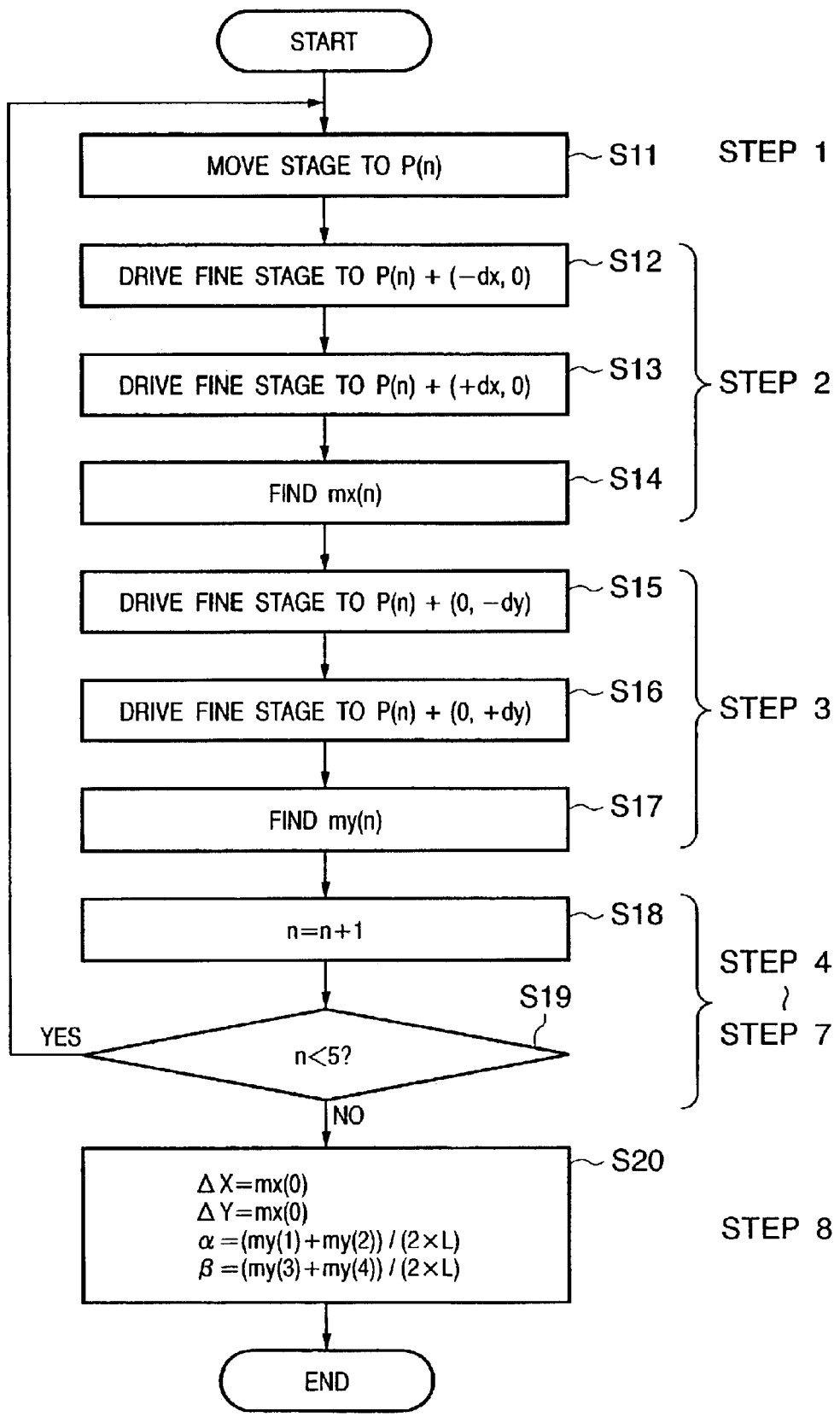
FIG. 8 is a flowchart useful in describing processing for setting parameters used in a position correction unit.

A value ΔY is further introduced in FIG. 6. This value corresponds to an amount of correction for bringing the position of the coarse stage exactly to the center of its stroke at the moment the coarse stage and fine stage are moved to the same target position. In other words, let ΔX and ΔY represent amounts of deviation along the X and Y directions, respectively, between the position of the origin of the fine stage 1 and the center position of the range of movement of this stage when the fine stage 1 and X, Y guide bars (5, 6) have been moved to the origin. In FIG. 6, ΔY (amount of deviation along the Y direction) of these deviations is introduced. A method of deciding ΔX, ΔY will be described later with reference to the flowchart of FIG. 8.

Figure 7:
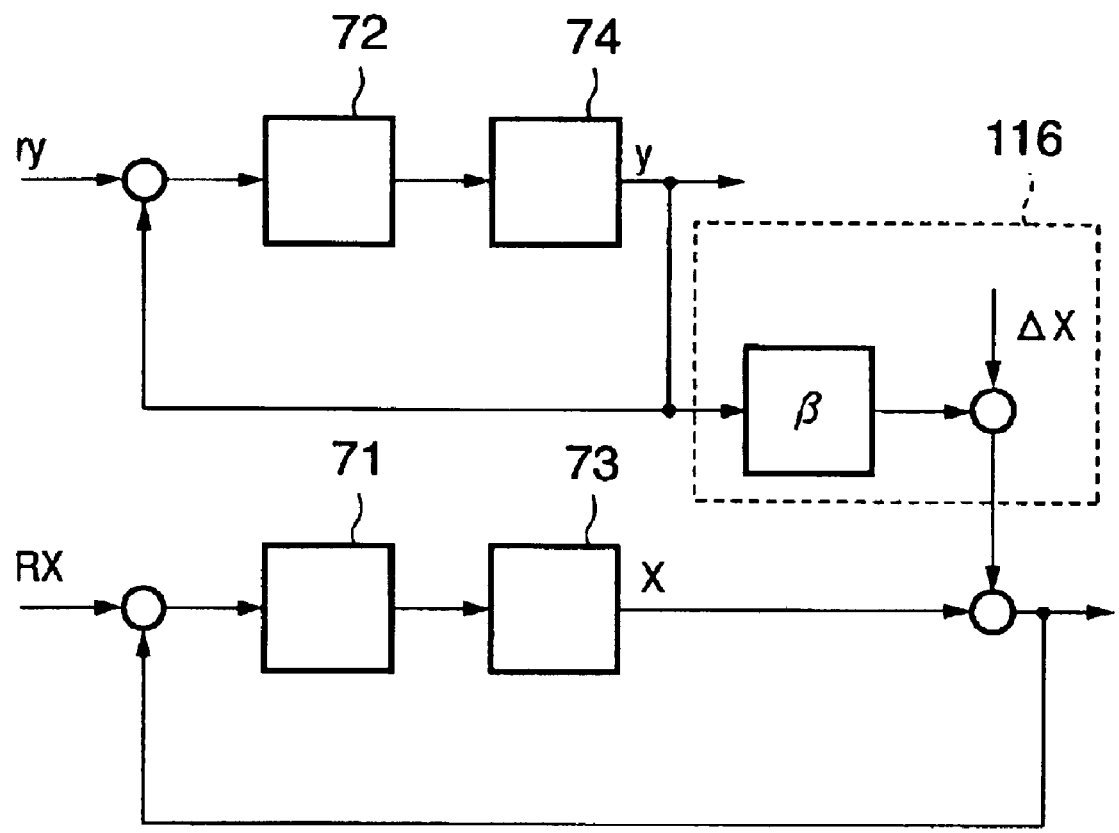
FIG. 7 is a block diagram illustrating implementation of stage drive control by a stage drive unit according to an embodiment of the present invention.

A similar control arrangement is adopted with regard to drive of the fine stage 1 along the Y direction and drive of the coarse stage along the X direction. FIG. 7 is a block diagram illustrating implementation of such control. Here compensating units 71, 72 operate in line with the compensating units 61, 62 shown in FIG. 6. Further, an open-loop characteristic 73 includes the drive section of the Y guide bar 6 and the laser interferometer 14, and an open-loop characteristic 74 includes an actuator for moving the fine stage 1 minutely along the Y direction and the laser interferometer 11. In FIG. 7, β corresponds to the angular deviation, and a position correction unit 116 uses β and the position y of the fine stage 1 along the Y direction to correct the position value X of the coarse stage along the X direction measured by the laser interferometer 14, and feeds back the corrected value to construct the control loop. This makes it possible to correct automatically the change in relative distance ascribable to the angle β. The above-mentioned ΔX is introduced in the position correction unit 116 of FIG. 7.

By virtue of the above arrangement, drive of the X guide bar 5 and Y guide bar 6 is controlled in such a manner that the target position coordinates (RX,RY) and detected position coordinates (X,Y) will satisfy the following equations:

$$RY = Y + \alpha x + \Delta Y$$

$$RX = X + \beta y + \Delta X$$

where the following holds:
X, Y: detected position coordinates of the X guide bar 5 and Y guide bar 6 of the coarse stage;
x, y: detected position coordinates of the fine stage 1;
ΔX, ΔY: amounts of deviation between the position of the origin of the fine stage 1 and the center position of the range of movement of this stage when the coarse stage and fine stage have been moved to the origin coordinates;
α: relative angle between the X travelling direction of the coarse stage and the X direction decided by the measurement system (laser interferometer 12) of the fine stage 1; and
β: relative angle between the Y travelling direction of the coarse stage and the Y direction decided by the measurement system (laser interferometer 11) of the fine stage 1.

Control of the stage device using the control systems shown in FIGS. 6 and 7 will be described further.

Figure 10:
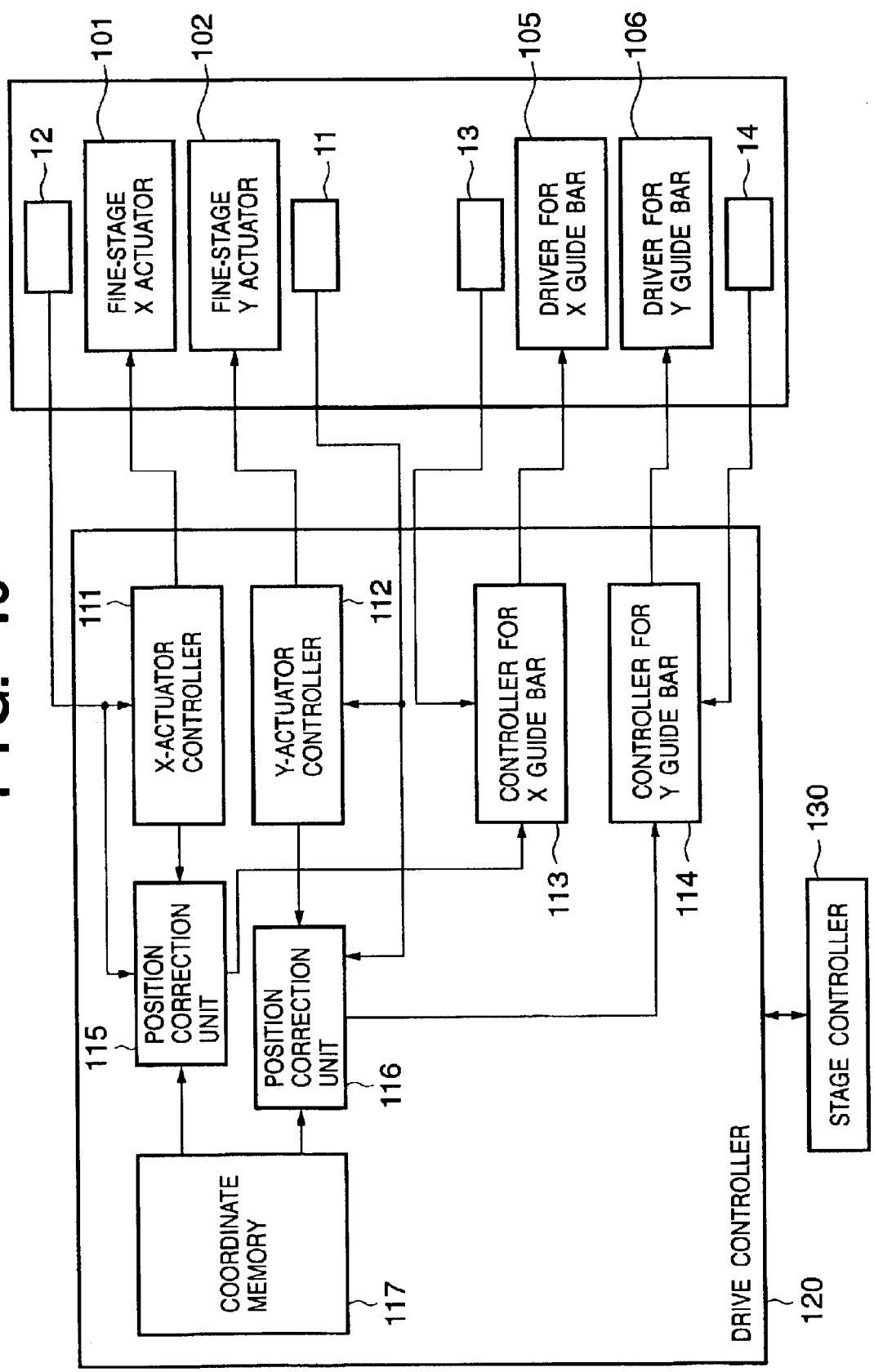
FIG. 10 is a block diagram illustrating a control implementation for a stage device according to an embodiment of the invention.

FIG. 10 is a block diagram illustrating a control implementation for a stage device according to an embodiment of the invention. The laser interferometers 11, 12 are as depicted in FIG. 1 and measure the Y and X positions, respectively, of the fine stage 1. An X actuator 101 for the fine stage 1 drives the fine stage 1 minutely along the X direction, and a Y actuator 102 for the fine stage 1 drives the fine stage 1 minutely along the Y direction. By way of example, linear motors of voice-coil type are ideal as the X actuator 101 and Y actuator 102 for the fine stage 1. A drive unit 105 is for moving the X guide bar 5 along the Y direction, and a drive unit 106 is for moving the Y guide bar 6 along the X direction.

A drive controller 120 controls driving of the fine-stage X, Y actuators (101, 102) and driving of the drive units (105, 106) of the X, Y guide bars, respectively. An X-actuator controller 111 drives the X actuator 101 of the fine stage based upon a given target position (rx) and an output signal from the laser interferometer 12. The X-actuator controller 111 corresponds to the arrangement in FIG. 6 to which the target position rx is input for generating the drive signal by the compensating unit 62, and the arrangement in FIG. 6 for feeding back the position signal x from the laser interferometer 12. Furthermore, the implementation is such that the open-loop characteristic 64 includes the fine-stage X actuator 101 and the laser interferometer 12.

A Y-actuator controller 112 drives the fine-stage Y actuator 102 based upon a given target position (ry) and an output signal from the laser interferometer 11. The Y-actuator controller 112 corresponds to the arrangement in FIG. 7 to which the target position ry is input for generating the drive signal by the compensating unit 72, and the arrangement in FIG. 7 for feeding back the position signal y from the laser interferometer 11. Furthermore, the implementation is such that the open-loop characteristic 74 includes the Y actuator 102 for the fine stage and the laser interferometer 11.

A controller 113 for the X guide bar controls the movement of the X guide bar 5 by the drive unit 105 for the X guide bar based upon the correction quantity from the position correction unit 115, described above with reference to FIG. 6, and the signal from the laser interferometer 13. The controller 113 for the X guide bar corresponds to the arrangement in FIG. 6 to which the target position RY is input for generating the drive signal by the compensating unit 61, and the arrangement in FIG. 6 for adding the correction value from the position correction unit 115 to the position signal Y from the laser interferometer 13 and feeding back the resultant signal. Furthermore, the implementation is such that the open-loop characteristic 63 includes the drive unit 105 for the X guide bar and the laser interferometer 13.

A controller 114 for the Y guide bar controls the movement of the Y guide bar 6 by the drive unit 106 for the Y guide bar based upon the correction quantity from the position correction unit 116, described later, and the signal from the laser interferometer 14. The controller 114 for the Y guide bar corresponds to the arrangement in FIG. 7 to which the target position RX is input for generating the drive signal by the compensating unit 71, and the arrangement in FIG. 7 for adding the correction value from the position correction unit 116 to the position signal X from the laser interferometer 14 and feeding back the resultant signal. Furthermore, the implementation is such that the open-loop characteristic 73 includes the drive unit 106 for the X guide bar and the laser interferometer 14.

It should be noted that the target positions (rx, ry, RX, RY) applied to the controllers 111 to 114 are supplied by a stage controller 130, described later.

A coefficient memory 117 stores parameters α, β, ΔY, ΔX used by the position correction units 115, 116.

The aforementioned stage controller 130 has a CPU and a memory (not shown), etc., and controls the overall operation of the stage device. In a case where the stage device is applied to an exposure apparatus, for example, the stage controller 130 may be implemented by an exposure-apparatus controller that controls the overall operation of the exposure apparatus.

The parameters α, β, ΔY, ΔX are stored beforehand in the coefficient memory 117 and utilized when the stage is driven. However, it is possible to adopt an arrangement in which these parameters are calculated by the stage controller 130 and stored in the coefficient memory 117. These parameters α, β, ΔY, ΔX can be calculated in accordance with the flowchart of FIG. 8. It will be assumed that this flowchart is executed by the stage controller 130.

Step 1: First, the coarse stage and fine stage are moved to position coordinates P(0)=(0,0) at S11. It is assumed here that the setting n=0 is made before the start of processing.

Step 2: Next, only the fine stage 1 is driven along the −X and +X directions by an amount dx greater than the nominal stroke of the fine stage, a stroke range in which the manipulated variable will not saturate is obtained and the midpoint of this range is adopted as the center of the stroke. First, the fine stage 1 is driven to (−dx,0) at S12, then the fine stage 1 is driven to (+dx,0) at S13. The position of the fine stage and the manipulated variable of the fine stage at this time are measured successively, a stroke range (range of possible movement) in which the manipulated variable of the fine stage will not saturate is obtained, and the midpoint of this range is adopted as mx(0) (S14). If the relative distance between the fine stage and coarse stage has exceeded the stroke range, this is a condition in which the two stages are interfering with each other and therefore the manipulated variable applied to the fine stage saturates. The above range, therefore, is adapted as the stroke range.

Figure 9:
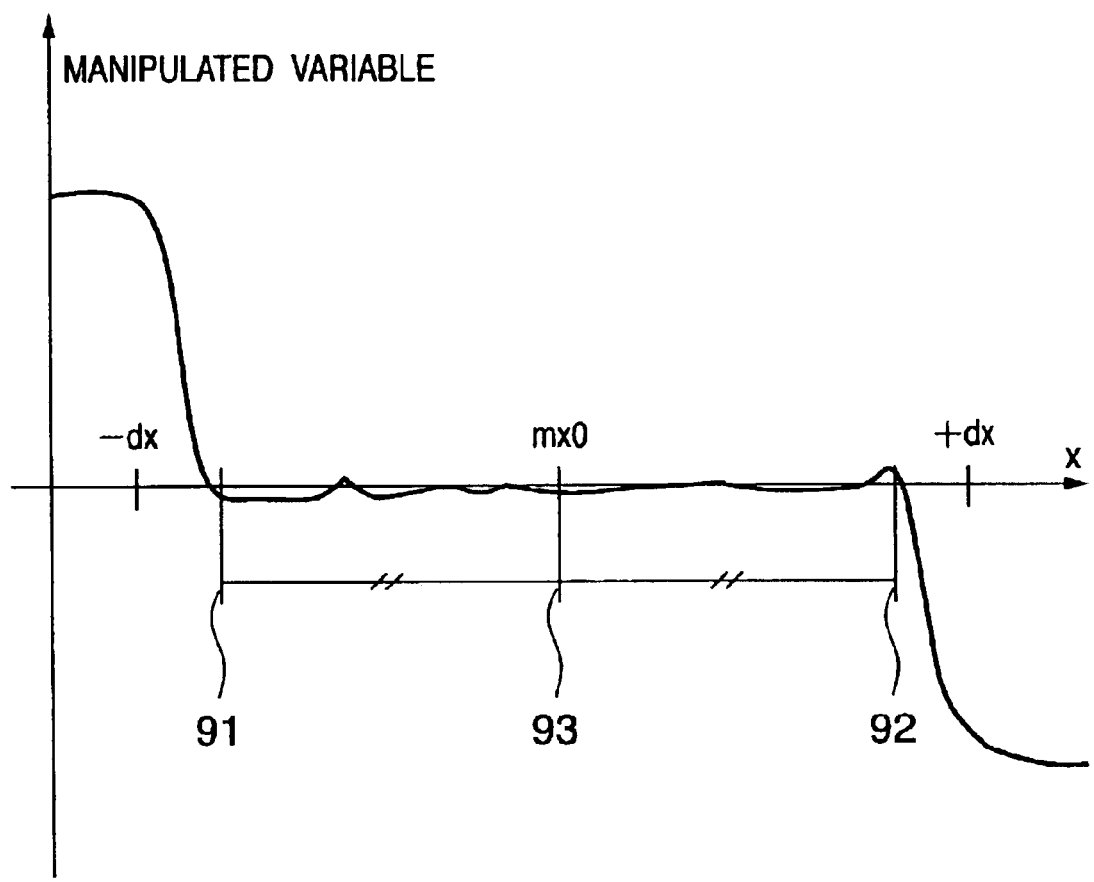
FIG. 9 is a diagram useful in describing the manner in which stroke center is decided from the relationship between amount of movement and manipulated variable of a fine stage.

This situation is illustrated in FIG. 9. Since a stroke range in which the manipulated variable does not saturate is found as indicated by positions 91 and 92 in FIG. 9, the midpoint 93 is adopted as the center of the stroke of fine stage 1 along the X direction.

Step 3: An operation similar to that of Step 2 is performed by driving the fine stage along the Y direction, whereby my(0) is found (S15, S16).

Step 4: Both the coarse stage and fine stage are moved to position coordinates P(1)=(L,0) (S18, S19, S20). An operation similar to that of Steps 2 and 3 is then performed to find mx(1), my(1).

Steps 5 to 7: The operation of Steps 2, 3 is carried out with regard to position coordinates P(2)=(−L,0), P(3)=(0,L), P(4)=(0,−L), and midpoints mx(2) to mx(4), my(2) to my(4) of stroke ranges in which the manipulated variable does not saturate are found.

Step 8: α, β, ΔY, ΔX are calculated according to the following equations using the results of measuring the drive-range midpoints of the fine stage obtained up to Step 7:

$$\Delta X = mx(0)$$

$$\Delta Y = my(0)$$

$$\alpha = [my(1) - my(2)]/(2 \times L)$$

$$\beta = [mx(3) - my(4)]/(2 \times L)$$

These steps correspond to using the stage position (0,0) as a reference, moving the stage along the X direction and obtaining the midpoint along Y axis, moving the stage along the Y direction and obtaining the midpoint along the X direction, and calculating α and β as the slope components of these midpoints. By storing the obtained results in the coefficient memory 117, this is reflected immediately in the block diagrams of FIGS. 6 and 7. As a result, the relative positions of the coarse stage and fine stage are held constant over the entire stage stroke range.

<Second Embodiment>

The first embodiment has been illustrated with regard to a method of correcting the position of the coarse stage using the relative angle α or β between the coarse stage and fine stage as a parameter. However, there is also a possibility that the relative angle will change depending upon the stage position. In such case, it is possible to perform an approximation using rational functions f(x), g(y) of the position of the fine stage instead of α, β, and then apply the approximation. In regard to the rational functions f(x), g(y), it will suffice to find n-number (n≧3) of mx(n), my(n) in the flowchart of FIG. 8 and then obtain the value of each of these three or more mx(n) and/or my(n) by statistical processing such as by the method of least squares.

In this case, drive of the X guide bar 5 and Y guide bar 6 is controlled in such a manner that the target position coordinates (RX,RY) and detected position coordinates (X,Y) will satisfy the following equations:

$$RY=Y+f(x)+\Delta Y$$

$$RX=X+g(y)+\Delta X$$

where the following holds:

X, Y: detected position coordinates of the X guide bar 5 and Y guide bar 6 of the coarse stage;

x, y: detected position coordinates of the fine stage 1;

ΔX, ΔY: amounts of deviation between the position of the origin of the fine stage 1 and the center position of the range of movement of this stage when the coarse stage and fine stage have been moved to the origin coordinates;

f(x): rational function that decides the amount of deviation at position x along the Y direction caused by deviation between the X travelling direction of the coarse stage and the X direction decided by the measurement system (laser interferometer 12) of the fine stage 1; and g(y): rational function that decides the amount of deviation at position y along the X direction caused by deviation between the Y travelling direction of the coarse stage and the Y direction decided by the measurement system (laser interferometer 111) of the fine stage 1.

It should be noted that f(x), g(y) may be given in the form of a reference table based upon the position of the fine stage. It should be obvious that such a reference table need only be stored in the coefficient memory 117. Further, the position correction units 115, 116 would need to be adapted so as to read out a corresponding coefficient from the reference table in memory 117 in dependence upon the position of the fine stage 1. Such a memory read-out circuit would be self-evident to one skilled in the art.

In accordance with each of the embodiments as described above, the relative distance between the coarse and fine stages can be held constant irrespective of stage position in the coarse-fine stage device. As a result, not only is stage assembly facilitated but it is also possible to minimize the necessary stroke of the fine stage. This contributes to an improvement in the dynamic characteristics of the fine stage and makes it possible to provide a stage of higher performance.

<Third Embodiment>

Figure 11:
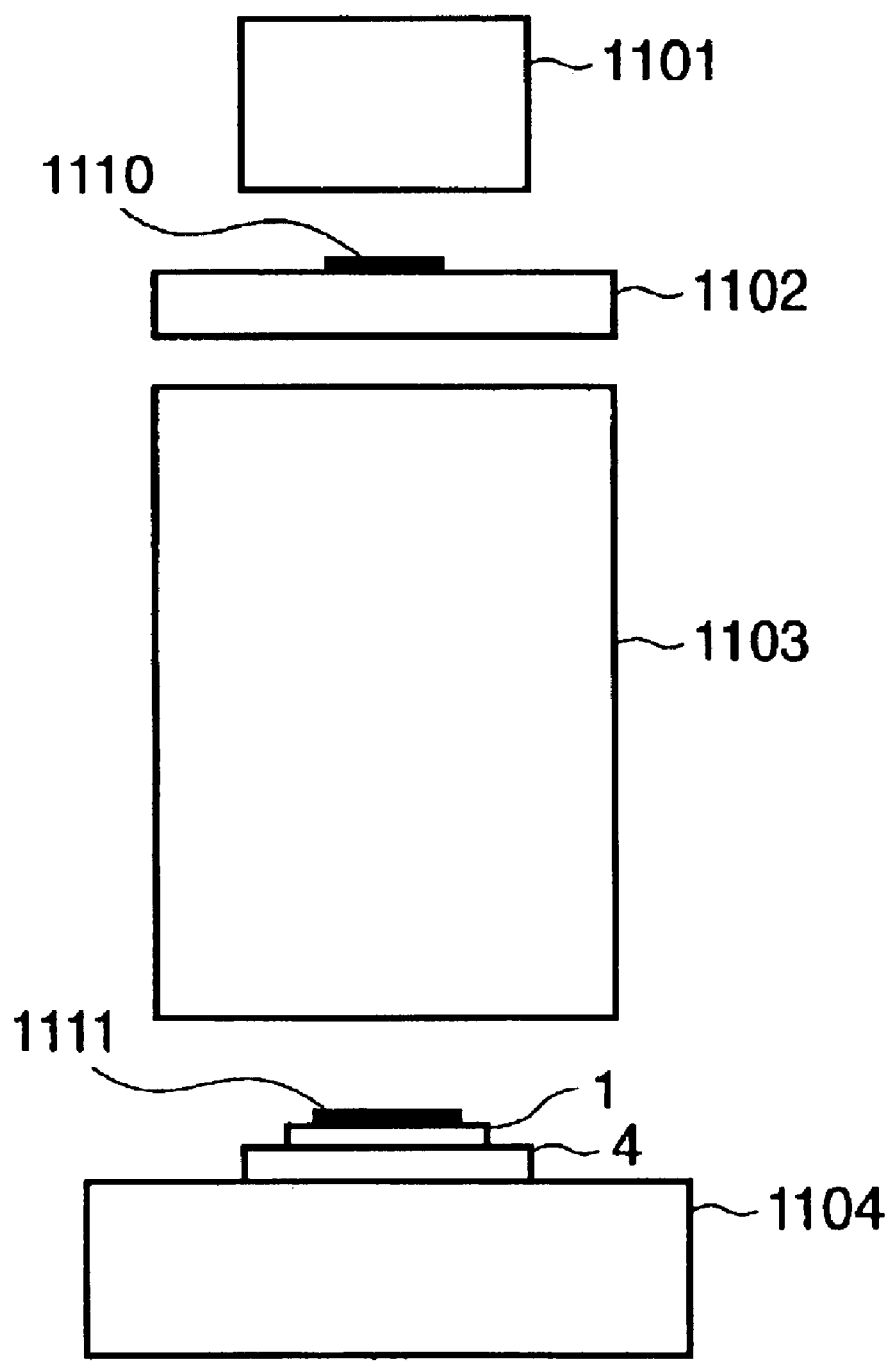
FIG. 11 is a diagram useful in describing the components of the principal part of an exposure apparatus to which a stage device according to the present invention can be applied.

FIG. 11 is a diagram useful in describing the components of the principal part of an exposure apparatus to which a stage device according to the first or second embodiment can be applied.

As shown in FIG. 11, an exposure light source 1101 illuminates a reticle 1110 on a reticle stage 1102 by exposing light. Exposing light that has passed through the reticle 1110 forms an image of reduced area on a wafer 1111 via a projection optical system 1103. As a result, a pattern that has been formed on the reticle 1110 is burned into wafer 1111.

The stage device described in the first or second embodiment is mounted on an exposure apparatus table 1104. As described above, the fine stage 1 is capable of moving over a very small range on the XY slider 4. The wafer 1111 to be subjected to exposure is mounted on the fine stage 1.

The exposure apparatus having the structure set forth above is a so-called step-and-repeat exposure apparatus for repeating exposure by moving the wafer 1111 by the stage device according to the first or second embodiment. It should noted that the exposure apparatus can be a step-and-scan exposure apparatus, in which the reticle stage 1102 is capable of being moved and the stepped movement and scanning exposure of the wafer are repeated. In this case, the stage device described in the first or second embodiment can be applied to the reticle stage 1102.

<Fourth Embodiment>

Figure 12:
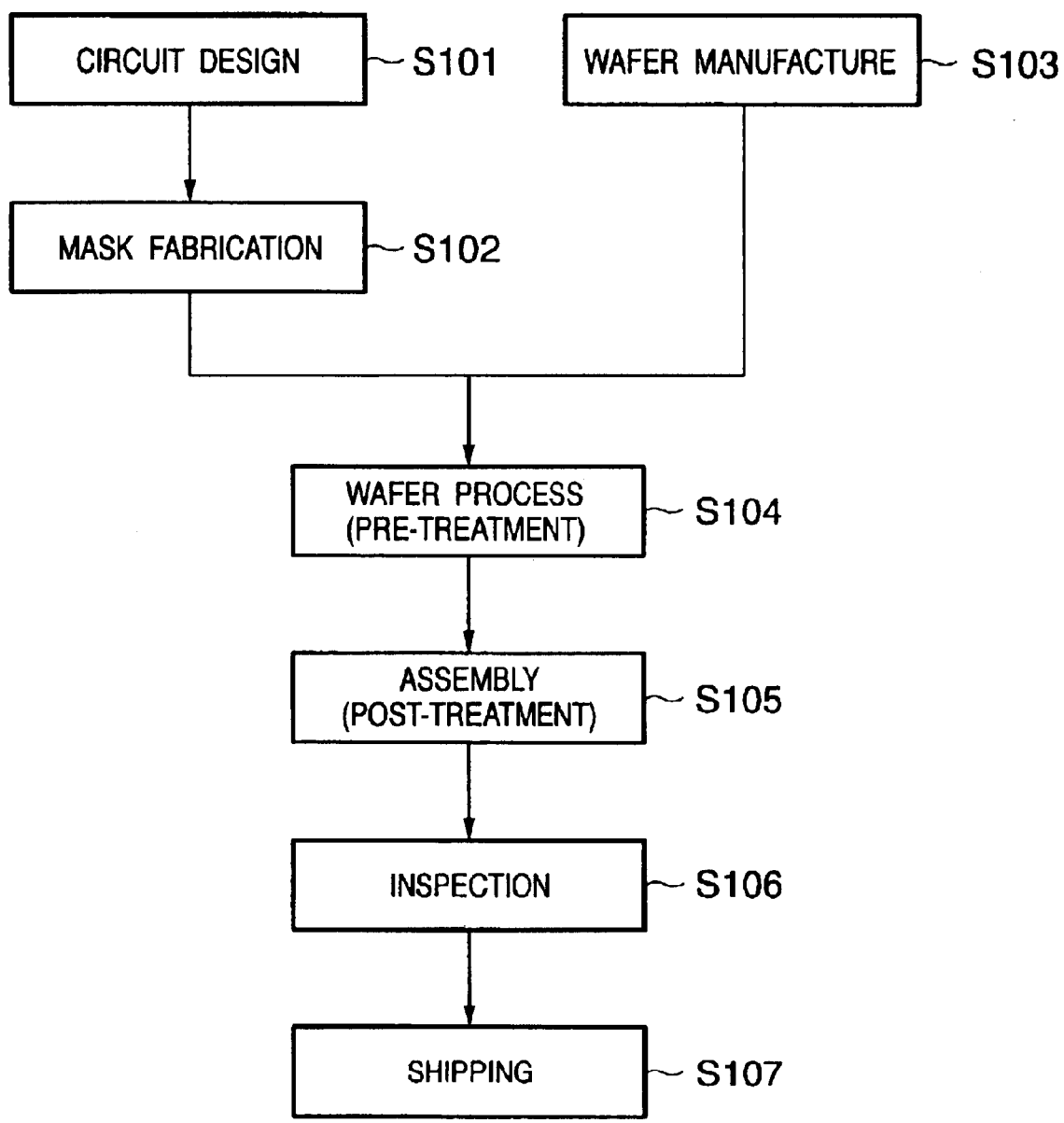
FIG. 12 is a diagram illustrating the overall flow of a process for manufacturing a semiconductor device.

A process for manufacturing a semiconductor device utilizing the exposure apparatus set forth above will now be described. FIG. 12 is a diagram illustrating the overall flow of a process for manufacturing a semiconductor device.

As shown in FIG. 12, the circuit for the semiconductor device is designed at step S101 (circuit design). A mask on which the designed circuit pattern has been formed is fabricated at step S102 (mask fabrication). Meanwhile, a wafer is manufactured using a material such as silicon at step 1S03 (wafer manufacture).

The actual circuit is formed on the wafer by lithography, using the prepared mask and wafer, at step S104 (wafer process), which is also referred to as "pre-treatment". Next, step 105 (assembly), which is also referred to as "post-treatment", is for obtaining the semiconductor chip using the wafer fabricated at step S104. This step includes steps such as actual assembly (dicing and bonding) and packaging (chip encapsulation). The semiconductor device fabricated at step S105 is subjected to inspections such as an operation verification test and a durability test, at step S106 (inspection). The semiconductor device is completed through these steps and then is shipped (step S107).

The pre- and post-treatments are performed at separate special-purpose factories, and maintenance is performed by the above-described remote maintenance system at each factory. Further, information for production management and machine maintenance is communicated between the pre- and post-treatment factories via the Internet or a special-purpose network.

Figure 13:
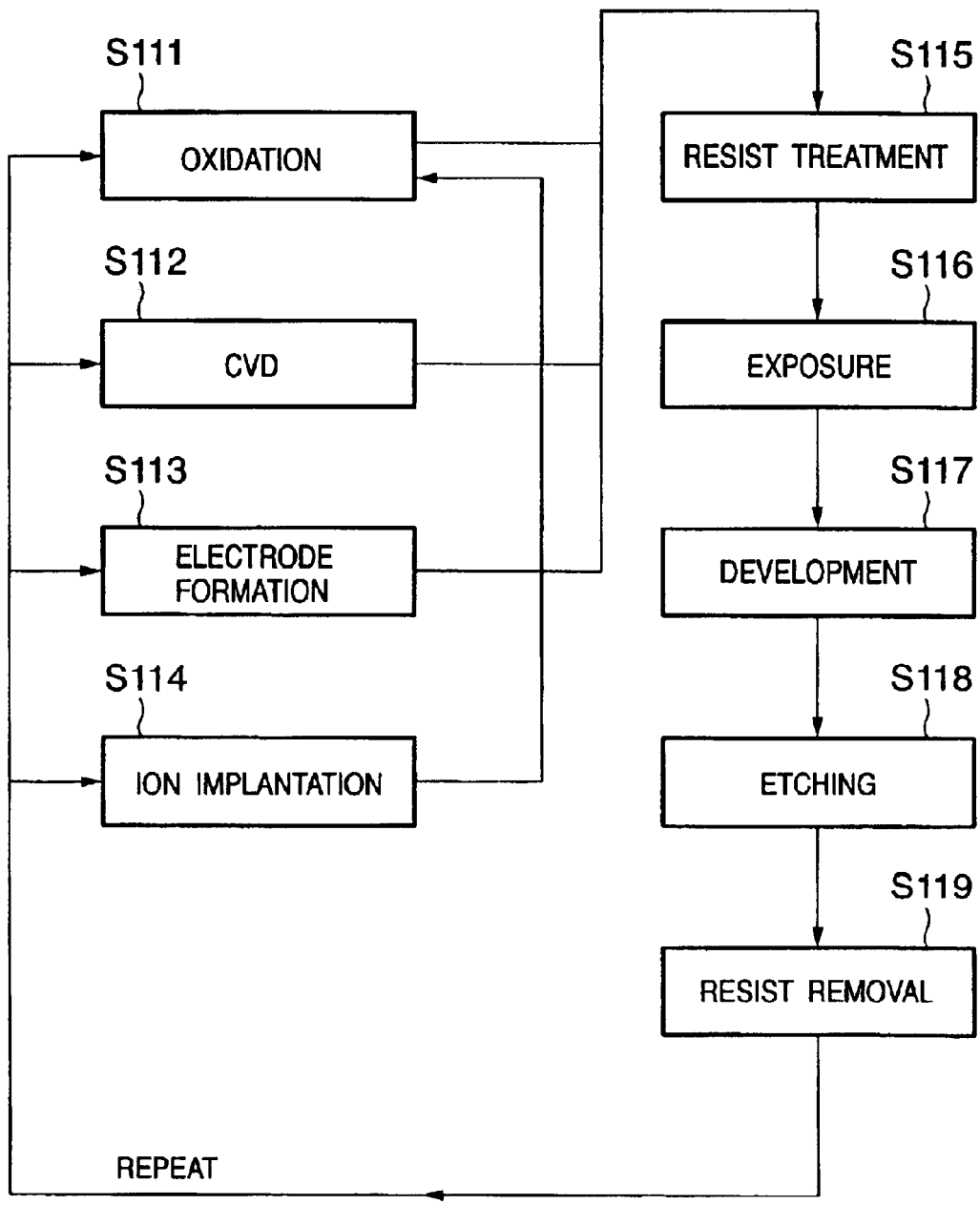
FIG. 13 is a diagram illustrating in detail the flow of the wafer process of FIG. 12.

FIG. 13 is a flowchart illustrating the detailed flow of the wafer process mentioned above. The surface of the wafer is oxidized at step 111 (oxidation). An insulating film is formed on the wafer surface at step 112 (CVD), electrodes are formed on the wafer by vapor deposition at step 113 (electrode formation), and ions are implanted in the wafer at step 114 (ion implantation). The wafer is coated with a photoresist at step 115 (resist treatment), the wafer is exposed to the circuit pattern to print the pattern onto the wafer by the above-described exposure apparatus at step 116 (exposure), and the exposed wafer is developed at step 117 (development). Portions other than the developed photoresist are etched away at step 118 (etching), and unnecessary resist left after etching is performed is removed at step 119 (resist removal).

Multiple circuit patterns are formed on the wafer by implementing these steps repeatedly.

Thus, in accordance with the present invention as described above, it is possible to provide a stage device that is capable of achieving positioning that exhibits an excellent dynamic characteristic or high precision.

Further, in accordance with the present invention, there is provided an exposure apparatus in which exposure precision of a pattern is enhanced by applying the above-described stage device to the exposure apparatus.

As many apparently widely different embodiments of the present invention can be made without departing from the spirit and scope thereof, it is to be understood that the invention is not limited to the specific embodiments thereof except as defined in the appended claims.

What is claimed is:

1. A stage device comprising:
   a first stage capable of moving in an XY travelling direction in a plane;
   a second stage capable of being moved with respect to said first stage over a minutely small range substantially parallel to a direction of movement of said first stage;
   first and second measurement means for respectively measuring positions of said first and second stages independently;
   driving means for driving said first and second stages using measurement values obtained by said first and second measurement means, respectively; and
   correction means for correcting drive of said first stage by said driving means, so as to maintain relative positions of said a first and second stages, based upon a deviation between an XY direction, which is decided by said second measurement means, the XY travelling direction of said first stage, and the position of said second stage obtained by said second measurement means.

2. The device according to claim 1, wherein when said second stage arrives at a target position, said correction means corrects drive of said first stage in such a manner that said second stage will be positioned at the center of its own range of possible movement.

3. The device according to claim 2, wherein said correction means corrects drive of said first stage by said driving means in such a manner that the following equations are satisfied:

$$RY = Y + \alpha x + \Delta Y$$

$$RX = X + \beta y + \Delta X$$

where the following holds:
   RX: target position of said first stage along the X direction;
   RY: target position of said first stage along the Y direction;
   X, Y: detected position coordinates of said first stage;
   x, y: detected position coordinates of said second stage;
   $\Delta X$, $\Delta Y$: amounts of deviation between position of said second stage and the center position of the range of possible movement of said second stage when said first and second stages have been moved to origin coordinates;
   $\alpha$: relative angle between the X travelling direction of said first stage and the X direction decided by said second measurement means; and
   $\beta$: relative angle between the Y travelling direction of said first stage and the Y direction decided by said second measurement means.

4. The device according to claim 3, further comprising decision means for obtaining the center position of the range of possible movement of said second stage by driving only said second stage at a plurality of positions in a range of possible movement of said first stage, and deciding the parameters $\alpha$, $\beta$, $\Delta X$, $\Delta Y$ based upon the plurality of center positions obtained.

5. The device according to claim 2, wherein said correction means corrects drive of said first stage by said driving means in such a manner that the following equations are satisfied:

$$RY = Y + f(x) + \Delta Y$$

$$RX = X + g(y) + \Delta X$$

where the following holds:
   RX: target position of said first stage along the X direction;
   RY: target position of said first stage along the Y direction;
   X, Y: detected position coordinates of said first stage;
   x, y: detected position coordinates of said second stage;
   $\Delta X$, $\Delta Y$: amounts of deviation between position of said second stage and the center position of the range of possible movement of said second stage when said first and second stages have been moved to origin coordinates;
   f(x): rational function that decides an amount of deviation at position x along the Y direction caused by deviation between the X travelling direction of said first stage and the X direction decided by said second measurement means; and
   g(y): rational function that decides an amount of deviation at position y along the X direction caused by deviation between the Y travelling direction of said second stage and the Y direction decided by said second measurement means.

6. The device according to claim 5, wherein said correction means retains f(x) and g(y) in table form in a memory and acquires corresponding values of f(x), g(y) based upon position (x,y) of said second stage measured by said second measurement means.

7. The device according to claim 5, wherein the center position of the range of possible movement of said second stage is obtained by driving only said second stage at a plurality of positions in a range of possible movement of said first stage, and the parameters $\Delta X$, $\Delta Y$ and rational functions f(x), f(y) are found based upon the plurality of center positions obtained.

8. The device according to claim 1, wherein said first and second measurement means are laser interferometers.

9. An exposure apparatus comprising:
   exposure means for projecting part of a pattern of a master plate onto a substrate via a projection optical system and exposing the substrate to a prescribed exposure area of the pattern; and
   the stage device, which is set forth in claim 1, for moving the master plate and/or the substrate in order to expose the substrate.

10. The apparatus according to claim 9, wherein said exposure means transfers the prescribed area of the pattern of the master plate to the substrate by moving the master plate and the substrate to thereby scan both the master plate and the substrate relative to the projection optical system.

11. A method of controlling a stage device having a first stage capable of moving in an XY travelling direction in a plane, a second stage capable of being moved with respect to said first stage over a minutely small range substantially parallel to direction of movement of said first stage, and first and second measurement means for respectively measuring positions of said first and second stages independently, said method comprising:
   a driving step of driving said first and second stages using measurement values obtained by said first and second measurement means, respectively; and a correcting step of correcting drive of said first stage by said driving step, so as to maintain relative positions of said first and second stages, based upon a deviation between an XY direction, which is decided by said second measurement means, and the XY travelling direction of said first stage, and the position of said second stage obtained by said second measurement means.

12. The method according to claim 11, wherein when said second stage arrives at a target position, said correction step corrects drive of said first stage in such a manner that said second stage will be positioned at the center of its own range of possible movement.

13. The method according to claim 12, wherein said correction step corrects drive of said first stage by said driving step in such a manner that the following equations are satisfied:

$$RY = Y + \alpha x + \Delta Y$$

$$RX = X + \beta y + \Delta X$$

where the following holds:

RX: target position of said first stage along the X direction;

RY: target position of said first stage along the Y direction;

X, Y: detected position coordinates of said first stage;

x, y: detected position coordinates of said second stage;

$\Delta X$, $\Delta Y$: amounts of deviation between a position of said second stage and the center position of the range of possible movement of said second stage when said first and second stages have been moved to origin coordinates;

$\alpha$: relative angle between the X travelling direction of said first stage and the X direction decided by said second measurement means; and $\beta$: relative angle between the Y travelling direction of said first stage and the Y direction decided by said second measurement means.

14. The method according to claim 13, further comprising a decision step of obtaining the center position of the range of possible movement of said second stage by driving only said second stage at a plurality of positions in a range of possible movement of said first stage, and deciding the parameters $\alpha$, $\beta$, $\Delta X$, $\Delta Y$ based upon the plurality of center positions obtained.

15. The method according to claim 12, wherein said correction step corrects drive of said first stage by said driving step in such a manner that the following equations are satisfied:

$$RY = Y + f(x) + \Delta Y$$

$$RX = X + g(y) + \Delta X$$

where the following holds:

RX: target position of said first stage along the X direction;

RY: target position of said first stage along the Y direction;

X, Y: detected position coordinates of said first stage;

x, y: detected position coordinates of said second stage;

$\Delta X$, $\Delta Y$: amounts of deviation between a position of said second stage and the center position of the range of possible movement of said second stage when said first and second stages have been moved to origin coordinates;

f(x): rational function that decides an amount of deviation at position x along the Y direction caused by deviation between the X travelling direction of said first stage and the X direction decided by said second measurement means; and g(y): rational function that decides an amount of deviation at position y along the x direction caused by deviation between the Y travelling direction of said second stage and the Y direction decided by said second measurement means.

16. The method according to claim 15, wherein said correction step retains f(x) and g(y) in table form in a memory and acquires corresponding values of f(x), g(y) based upon position (x,y) of said second stage.

17. The method according to claim 16, further comprising a decision step of obtaining the center position of the range of possible movement of said second stage by driving only said second stage at a plurality of positions in a range of possible movement of said first stage, and deciding the parameters $\Delta X$, $\Delta Y$ and rational functions f(x), f(y) based upon the plurality of center positions obtained.

18. A controlling method of a stage apparatus, comprising:

a first movable stage, a second stage movable with respect to said first stage, and first and second measurement means for respectively measuring positions of said first and second movable stages independently, wherein there is a deviation between a measuring axis of said second measuring means and a moving axis of said first movable stage, said method comprising the steps of:

obtaining an amount of the deviation; and moving said first movable stage, based on the amount of the deviation and a position of said second stage in its moving direction, so as to maintain a relative position between said first and second stages in a direction orthogonal to said moving direction.

* * * * *

UNITED STATES PATENT AND TRADEMARK OFFICE
CERTIFICATE OF CORRECTION

PATENT NO. : 6,859,265 B2  Page 1 of 1
DATED : February 22, 2005
INVENTOR(S) : Hiroaki Takeishi It is certified that error appears in the above-identified patent and that said Letters Patent is hereby corrected as shown below:

Column 11,
Line 26, the first occurrence of "a" should be deleted.

Column 12,
Line 40, "f(y)" should read -- g(y) --.
Line 61, "direction" should read -- a direction --.

Column 14,
Line 20, "x direction" should read -- X direction --.
Line 33, "f(y)" should read -- g(y) --.

Signed and Sealed this

Nineteenth Day of July, 2005

JON W. DUDAS
*Director of the United States Patent and Trademark Office*